(12) United States Patent
Lu et al.

(10) Patent No.: US 6,680,249 B2
(45) Date of Patent: Jan. 20, 2004

(54) SI-RICH SURFACE LAYER CAPPED DIFFUSION BARRIERS

(75) Inventors: Jiong-Ping Lu, Dallas, TX (US); Wei-Yung Hsu, Dallas, TX (US); Qi-Zhong Hong, Dallas, TX (US); Richard A. Faust, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/185,383

(22) Filed: Jun. 28, 2002

(65) Prior Publication Data

US 2002/0192950 A1 Dec. 19, 2002

Related U.S. Application Data

(63) Continuation of application No. 09/645,157, filed on Aug. 24, 2000, now abandoned.
(60) Provisional application No. 60/150,996, filed on Aug. 27, 1999.

(51) Int. Cl.[7] .............................................. H01L 21/44
(52) U.S. Cl. ...................... 438/653; 438/654; 438/685; 438/786
(58) Field of Search ................................ 438/653, 652, 438/654, 655, 656, 685, 786

(56) References Cited

U.S. PATENT DOCUMENTS

| | | | |
|---|---|---|---|
| 5,614,437 A | * | 3/1997 | Choudhury ................. 438/653 |
| 5,686,355 A | | 11/1997 | Sumi et al. |
| 5,705,442 A | * | 1/1998 | Yen et al. ................. 438/653 |
| 5,736,192 A | | 4/1998 | Okamoto |
| 5,913,147 A | | 6/1999 | Dubin et al. |
| 5,972,804 A | * | 10/1999 | Tobin et al. ............... 438/786 |
| 6,001,730 A | | 12/1999 | Farkas et al. |
| 6,017,818 A | * | 1/2000 | Lu ........................... 438/653 |
| 6,037,013 A | | 3/2000 | Hsu et al. |
| 6,093,966 A | | 7/2000 | Venkatraman et al. |
| 6,127,256 A | | 10/2000 | Matsuno |
| 6,214,731 B1 | | 4/2001 | Nogami et al. |
| 6,365,511 B1 | | 4/2002 | Kizilyalli et al. |
| 6,475,912 B1 | | 11/2002 | Harada |

FOREIGN PATENT DOCUMENTS

EP          0 869 544 A2     10/1998

OTHER PUBLICATIONS

Wolf, Stanley, "Silicon Processing for the VLSI Era," vol. 2, Lattice Press 1990, p. 132.

* cited by examiner

*Primary Examiner*—Kevin M. Picardat
(74) *Attorney, Agent, or Firm*—Jacqueline J. Garner; W. James Brady, III; Frederick J. Telecky, Jr.

(57) ABSTRACT

A copper interconnect having a transition metal-nitride barrier (106) with a thin metal-silicon-nitride cap (108). A transition metal-nitride barrier (106) is formed over the structure. Then the barrier (106) is annealed in a Si-containing ambient to form a silicon-rich capping layer (108) at the surface of the barrier (106). The copper (110) is then deposited over the silicon-rich capping layer (108) with good adhesion.

10 Claims, 2 Drawing Sheets

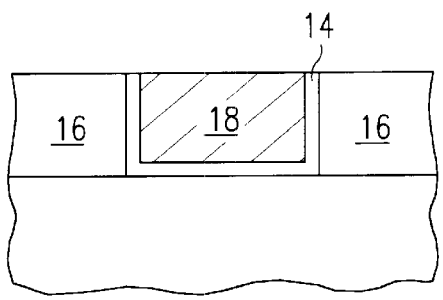
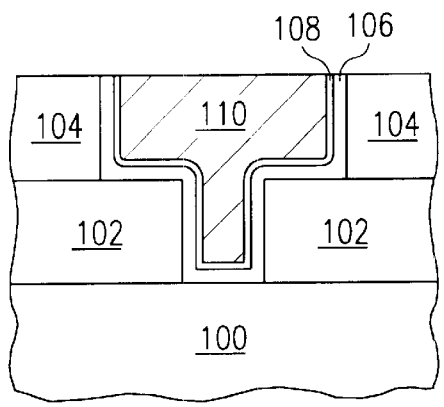
FIG. 1
(PRIOR ART)
FIG. 2
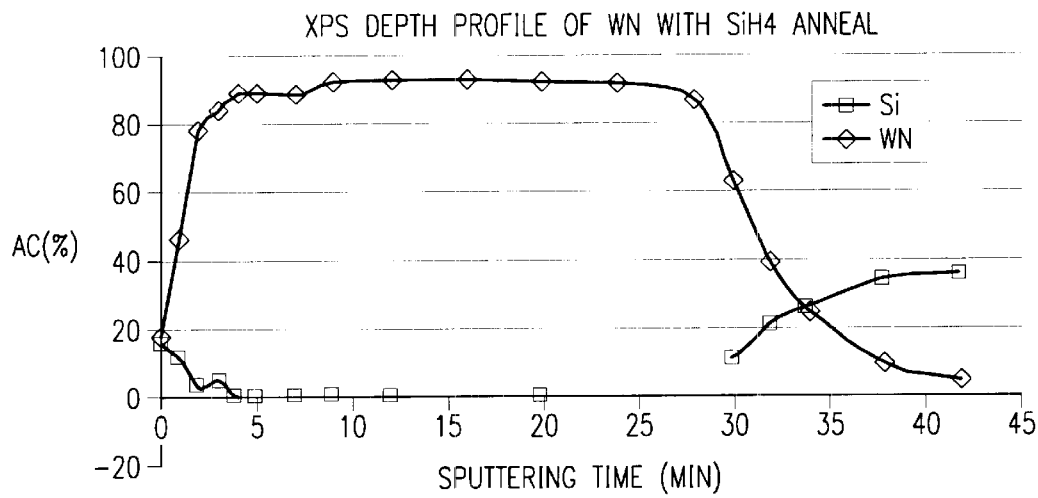
FIG. 4
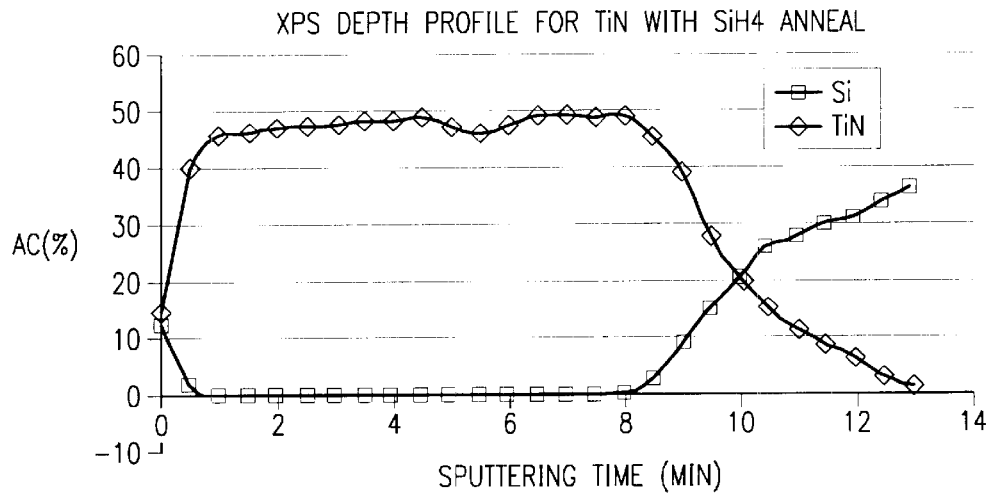
FIG. 5

SI-RICH SURFACE LAYER CAPPED DIFFUSION BARRIERS

This is a continuation application of Ser. No. 09/645,157 filed Aug. 24, 2000, now abandoned, which is a non-provisional application of provisional application No. 60/150,996 filed Aug. 27, 1999.

FIELD OF THE INVENTION

The invention is generally related to the field of interconnect layers in semiconductor devices and more specifically to diffusion barriers for copper interconnect layers.

BACKGROUND OF THE INVENTION

As the density of semiconductor devices increases, the demands on interconnect layers for connecting the semiconductor devices to each other also increases. Therefore, there is a desire to switch from the traditional aluminum metal interconnects to copper interconnects. Unfortunately, suitable copper etches for a semiconductor fabrication environment are not readily available. To overcome the copper etch problem, damascene processes have been developed.

In a damascene process, the IMD is formed first. The IMD is then patterned and etched. The barrier layer 14 and a copper seed layer are then deposited over the structure. The barrier layer 14 is typically tantalum nitride or some other binary transition metal nitride. The copper layer is then formed using the seed layer over the entire structure. The copper is then chemically-mechanically polished (CMP'd) to remove the copper from over the IMD 16, leaving copper interconnect lines 18 as shown in FIG. 1. A metal etch is thereby avoided.

Barrier layer 14 is required because copper has high diffusivity into dielectrics. Unfortunately, conventional diffusion barriers have limited wettability (adhesion) with copper. This causes voids in the copper during the via fill and negatively impacts the electromigration performance. Metal-silicon-nitrides have better wetting properties. Unfortunately, current methods of forming these metal-silicon-nitrides are difficult to perform and result in a film having high resistivity.

Another approach is to combine a layer of TaN with a layer of Ta. TaN provides good adhesion to FSG (fluorine-doped silicate glass) but poor adhesion to copper. Ta provides a good adhesion to copper but poor adhesion to FSG. Unfortunately, when the TaN/Ta stack is used, fluorine dopants diffuse through the TaN to react with the Ta to form TaF. TaF is volatile and tends to peel off. Thus, an improved barrier for copper interconnects is desired.

SUMMARY OF THE INVENTION

The invention is a copper interconnect having a transition metal-nitride barrier with a thin metal-silicon-nitride cap. A transition metal-nitride barrier is formed over the structure. Then the barrier is annealed in a Si-containing ambient to form a silicon-rich capping layer at the surface of the barrier. The copper is then deposited over the silicon-rich capping layer.

An advantage of the invention is providing a diffusion barrier with improved adhesion with copper with low resistance.

This and other advantages will be apparent to those of ordinary skill in the art having reference to the specification in conjunction with the drawings.

BRIEF DESCRIPTION OF THE DRAWINGS

In the drawings:

FIG. 1 is a cross-sectional diagram of a prior art copper interconnect layer;

FIG. 2 is a cross-sectional diagram of a copper interconnect layer having a diffusion barrier with silicon-rich capping layer according to the invention;

FIG. 4 is a XPS graph of a WN film with $SiH_4$ anneal; and

FIG. 5 is a XPS graph of a TiN film with $SiH_4$ anneal.

DETAILED DESCRIPTION OF THE EMBODIMENTS

Figure 3A:
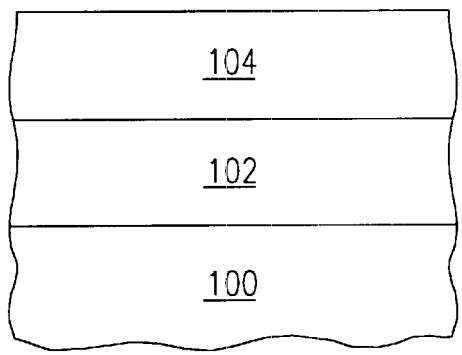
FIGS. 3A–3E are cross-sectional diagrams of the interconnect of FIG. 2 at various stages of fabrication, according to the invention.

The invention will now be described in conjunction with a copper interconnect layer. Those of ordinary skill in the art will realize that the benefits of the invention may be applied to diffusion barriers in general where improved wetting property is desired without a significant increase in resistance.

A silicon-rich surface layer capping a diffusion barrier 106, according to the invention, is shown in FIG. 2. An interlevel dielectric (ILD) 102 and intrametal dielectric (IMD) 104 are located over a semiconductor body 100. Semiconductor body 100 comprises transistors (not shown) and isolation structures (not shown) formed herein. Semiconductor body 100 may also comprise other devices and structures as are known in the art. Semiconductor body 100 may include additional interconnect layers (not shown) and/or additional interconnect layers may be formed over IMD 104.

Suitable materials for ILD 102 and IMD 104 are known in the art. ILD 102 and IMD 104 may comprise the same or differing materials. For example, ILD 102 and IMD 104 may comprise a PETEOS (Plasma Enhanced TetraEthyOxySilane) oxide or a low-k material such as xerogel, FSG (fluorine-doped silicate glass), HSQ (hydrogen silsesquioxane), organic low-k materials, or a combination thereof.

Diffusion barrier 106 is located within in ILD 102 and IMD 104. Diffusion barrier 106 comprises a transition metal nitride with a silicon-rich capping layer 108. For example, diffusion barrier 106 may comprise TaN or WN with a Ta—Si—N or W—Si—N capping layer 108, respectively. Copper 110 is located over surface layer 108 of barrier 106. The transition metal-nitride portion of diffusion barrier 106 has low resistance and excellent wettability to dielectrics such as FSG. However, the transition metal-nitrides have poor wettability to copper. The metal-silicon-nitrides, on the other hand, have good wettability to copper, but much higher resistance. By having a thin capping layer 108 of metal-silicon-nitride and the bulk of the barrier 106 being metal-nitride, both low resistance and good wettability to copper are obtained.

Table 1 is a comparison of Ta, TaN, and TaSiN for copper metallization.

TABLE I

| Barrier | Ta | TaN | TaSiN |
|---|---|---|---|
| Crystallinity | strong | weak | amorphous |
| Stress | −2100 | −2100 | −500 |

TABLE I-continued

| Barrier | Ta | TaN | TaSiN |
|---|---|---|---|
| Sidewall Agglomeration | small islands | large islands | near continuous |
| RMS (Å) | 35 | 400 | 8 |

As shown in Table I, TaSiN is amorphous. Amorphous layers tend to be good barriers for copper because they do not have grain boundaries for the copper to diffuse through. The sidewall agglomeration for copper is also very good for TaSiN. On TaN, copper forms large islands and thus, voids in the copper which are bad for electromigration. On Ta, copper forms small islands, which are better, but not as good as the near continuous layer on TaSiN. The improved properties of TaSiN can be achieved with a very thin layer. Thus, a thin surface layer of TaSiN is all that is needed to provide good adhesion for copper.

A method for forming diffusion barrier 106, according to the invention, will now be discussed with reference to FIGS. 3A–E. Referring to FIG. 3A, semiconductor body 100 is processed through the formation of ILD 102 and IMD 104. This includes the formation of isolation structures, transistors and other desired devices, as is known in the art. Suitable methods for forming ILD 102 and IMD 104 are known in the art. ILD 102 and IMD 104 may comprise the same or differing materials. For example, ILD 102 and IMD 104 may comprise a PETEOS (Plasma Enhanced TetraEthyOxySilane) oxide or a low-k material such as xerogel, FSG (fluorine-doped silicate glass), HSQ (hydrogen silsesquioxane), organic low-k materials, or a combination thereof. IMD 104 may be part of the first interconnect layer or any subsequent interconnect layer.

Figure 3B:
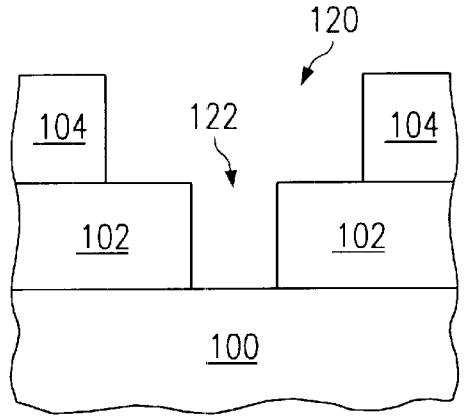

Referring to FIG. 3B, a trench 120 is etched in IMD 104. If vias are desired and have not already been formed, a dual damascene process may be used to form both trench 102 in IMD 104 and a via 122 in ILD 102. If via connections have already been fabricated, only trench 120 is etched.

Figure 3C:
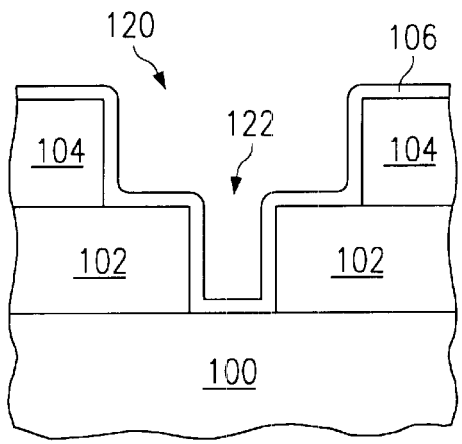

Next, a diffusion barrier 106 is formed on the surface of IMD 104 and on the surface of trench 120, as shown in FIG. 3C. Diffusion barrier 106 is also formed on the surface of via 122, if a via connection has not already been formed. Diffusion barrier 106 comprises a transition metal-nitride. For example, diffusion barrier 106 may comprise TaN, TiN, WN, or MoN. The thickness of diffusion barrier 106 is on the order of 50–500 Å. A conformal deposition process is desirable in order to provide a sufficient barrier on the sidewalls of the trench and via. As an example, diffusion barrier 106 may be deposited using a thermal CVD (chemical vapor deposition) process or ionized sputtering process.

Figure 3D:
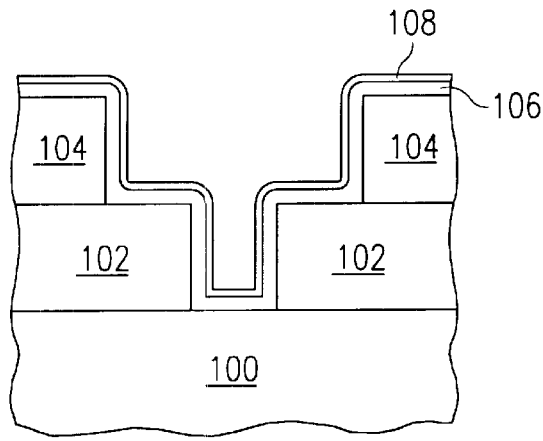

Referring to FIG. 3D, a silicon-rich cap layer 108 is formed at the surface of diffusion barrier 106. Silicon-rich cap layer 108 may be formed by subjecting diffusion barrier 106 to an anneal in a silicon-containing ambient. Exemplary gases for use during the anneal include silane ($SiH_4$), $Si_2H_6$, and $Si(CH_3)4$. Silicon decomposes at low temperatures (e.g., on the order of 360° C.) and is incorporated into the surface of diffusion barrier 106. The low temperature anneal incorporates silicon in a thin layer at the surface of barrier 106 and creates a silicon-rich capping layer 108. Silicon is not incorporated into the bulk of the film. Silicon-rich capping layer 108 has a thickness on the order of 5–20 Å.

The silicon-rich capping layer 108 improves the copper adhesion properties of the diffusion barrier 106. Because silicon incorporation is limited to the near surface, silicon-rich capping layer 108 does not significantly impair the resistance of the barrier 106. The process for forming barrier 106 with silicon-rich capping layer 108 is easy to implement. the process is based on current barrier technology combined with a simple anneal step.

Figure 3E:
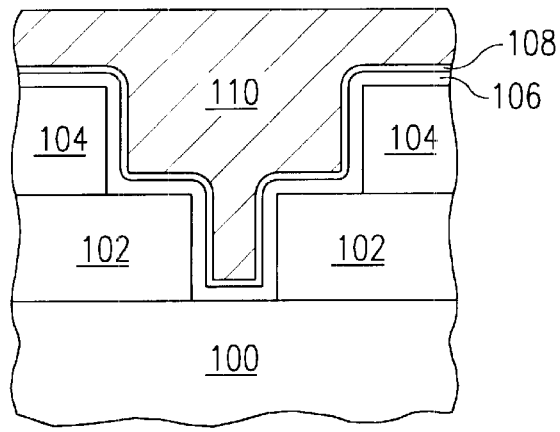

Referring to FIG. 3E, a copper layer 110 is formed on the silicon-rich capping layer 108 of barrier layer 106. Copper layer 110 may be formed by first forming a copper seed layer and then using an electroplating process to deposit the remaining copper. The silicon in silicon-rich capping layer 108 may form a copper-silicide at the interface. The copper-silicide further improves adhesion.

The copper layer 110 and barrier layer 106 are then removed back, for example by CMP (chemical-mechanical polish) to substantially planar with IMD 104, as shown in FIG. 2.

The feasibility of forming a silicon-rich capping layer on a transition metal-nitride is illustrated in FIGS. 4 and 5. FIG. 4 is a XPS depth profile of film composition versus sputtering time for a WN film with $SiH_4$ anneal. A WN film was deposited on a silicon substrate and then subject to an anneal in $SiH_4$ at a 360° C. susceptor temperature. Significant levels of silicon are incorporated in the film only at the surface. The XPS depth profile indicates silicon presence in the first 5 minutes of sputtering time. Sputtering time is an indication of depth as the surface is slowly removed. The cross-over point after 30 minutes indicates the silicon substrate on which the WN was deposited.

FIG. 5 is a similar XPS graph for a TiN film with $SiH_4$ anneal. A TiN film was deposited on a silicon substrate and then subject to an anneal in $SiH_4$ at a 360° C. susceptor temperature. Again, silicon is incorporated in the film only at the surface. The XPS depth profile indicates silicon presence in the first minute of sputtering time. The cross-over point after 8 minutes indicates the silicon substrate on which the TiN was deposited.

The diffusion barrier 106 with silicon-rich capping layer 108 may be applied to the first or any subsequent copper interconnect layer. Furthermore, it may be applied to one, some, or all of the copper interconnect layers.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claim is:

1. A method of fabricating a diffusion barrier, comprising the steps of:

forming a transition metal nitride film; and annealing said transition metal nitride film in a silicon-containing ambient to form a silicon-rich capping layer at a surface of said transition metal nitride film without incorporating silicon into a bulk portion of a said transition metal nitride film.

2. The method of claim 1, wherein said transition metal nitride film comprises TaN, TiN, WN or MoN.

3. The method of claim 1, wherein said annealing step is performed using silane at a temperature on the order of 360° C.

4. The method of claim 1, wherein said silicon-rich capping layer has a thickness on the order of 5–20 Å.

5. The method of fabricating an integrated circuit, comprising the steps of:

forming a dielectric layer over a semiconductor body;

etching a trench in said dielectric layer;

forming a transition metal nitride over said dielectric layer including within said trench;

annealing sold transition metal nitride in a silicon-containing ambient to incorporate silicon in a surface of said transition metal nitride to form a transition metal silicon nitride capping layer at said surface of said transition metal nitride without incorporating silicon in a bulk portion of said transition metal nitride; and forming a copper layer on said transition metal silicon-nitride capping layer.

6. The method of claim 5, wherein said transition metal nitride film comprises TaN, TiN, WN or MoN.

7. The method of claim 5, wherein said annealing step is performed using silane at a temperature on the order of 360° C.

8. The method of claim 5, wherein said transition metal silicon nitride capping layer has a thickness on the order of 5–20 Å.

9. The method of claim 5, wherein said annealing step is performed using $SiH_4$ or $Si_2H_6$.

10. The method of claim 5, wherein said annealing step is performed using $Si(CH_3)4$.

* * * * *